(12) United States Patent
Harner

(10) Patent No.: US 6,737,915 B1
(45) Date of Patent: May 18, 2004

(54) TUBE INPUT JFET OUTPUT (TIJO) ZERO FEEDBACK AUDIO AMPLIFIER

(76) Inventor: Stephen Arthur Harner, 8081 Meadow Hill, Frisco, TX (US) 75034

( * ) Notice: Subject to any disclaimer, the term of this patent is extended or adjusted under 35 U.S.C. 154(b) by 0 days.

(21) Appl. No.: 10/292,959

(22) Filed: Nov. 13, 2002

(51) Int. Cl.[7] .............................. H03F 5/00; H03F 21/00
(52) U.S. Cl. ......................... 330/3; 330/299; 330/310
(58) Field of Search ........................ 330/3, 133, 150, 330/299, 310

(56) References Cited

U.S. PATENT DOCUMENTS 3,353,109 A * 11/1967 Carlon ........................ 330/3
5,017,884 A * 5/1991 Perandi ....................... 330/3
5,450,034 A * 9/1995 Werrbach .................... 330/3
6,507,240 B2 * 1/2003 Butler ......................... 330/3

* cited by examiner

Primary Examiner—Khanh Van Nguyen

(57) ABSTRACT

A hybrid preamplifier with a vacuum tube input stage driving a JFET output stage dubbed TIJO (for Tube Input JFET Output) that uses zero feedback circuitry and a common low voltage B+ power supply. A single output low voltage transformer provides all necessary voltages including the filament voltage. No attempt is made to minimize distortion or maximize bandwidth by adding feedback. The vacuum tube is mounted externally to allow easy tube swapping for varying the gain and tonal palette, with no dangerous high voltages present.

9 Claims, 2 Drawing Sheets

TUBE INPUT JFET OUTPUT (TIJO) ZERO FEEDBACK AUDIO AMPLIFIER

REFERENCES CITED

U.S. Patent Documents:

| 4163198 | July, 1979 | Berning | 330/277 |
| 5017884 | May, 1991 | Perandi | 330/3 |
| 5022305 | June, 1991 | Butler | 84/711 |
| 5450034 | September, 1995 | Werrbach | 330/3 |

Other Documents:

Hamm, Russell O., "Tubes Versus Transistors—Is There an Audible Difference", Presented Sep. 14, 1972, at the 43rd Convention of the Audio Engineering Society, New York.

BACKGROUND OF THE INVENTION

1. Field of the Invention

The present invention relates to the field of electronic amplifiers. More particularly, the present invention relates to the use of vacuum tubes with low supply voltage to provide amplification of musical electronic signals.

2. Description of The Prior Art

Russell O. Hamm, in his brilliant paper "Tubes Versus Transistors—Is There an Audible Difference", says: "Vacuum-tube amplifiers differ from transistor and operational amplifiers because they can be operated in the overload region without adding objectionable distortion. The combination of the slow rising edge and the open harmonic structure of the overload characteristics form an almost ideal sound-recording compressor." He also states that vacuum tube circuitry only makes a definite audible difference when it is used at the mechanical-electrical interface.

Vacuum tubes are rarely used along with transistors, so called hybrid circuits, because of the different supply voltage requirements. Power supplies for vacuum tubes are generally much more expensive, and dangerous, because of the need fort high voltages and a separate filament heater voltage.

It would be an improvement over prior art to develop a hybrid circuit that uses a single low voltage transformer, for example 6 to 24 volts AC, to power the heater filament(s) and to produce a common B+ load voltage for the vacuum tube and transistor devices, for example 12 to 48 volts DC. However, vacuum tubes operated at low voltage typically have low gain due to increased plate resistance and resulting lowered transconductance. The few cases of prior art that attempt to solve the low transconductance problem use various transistor devices that do not fully preserve the pleasing harmonics and overload compression of vacuum tubes.

BRIEF SUMMARY OF THE INVENTION

The present invention is a hybrid vacuum tube and JFET audio amplifier, hereinafter called TIJO (for Tube Input JFET Output), using a simple, low voltage power supply. The present invention solves the low transconductance problem associated with operating vacuum tubes at low voltages by connecting the tube output to a JFET (junction field effect transistor) while preserving the pleasing harmonics and overload compression of the vacuum tube.

The primary objective of the TIJO is to provide a transducer interlace audio amplifier incorporating a device that produces low order harmonics when overdriven. Said transducer may be a microphone, guitar, or even a digital to analog convertor. Vacuum tubes produce low order harmonics where each subsequent harmonic (higher frequency) is much lower in level than the previous harmonic. This characteristic is most relevant to the input stage which is connected directly to the transducer (via a coupling capacitor) as this is where transient peaks are most likely to be encountered.

A second objective of the TIJO is to disregard the standard practice of using negative feedback to reduce distortion and increase bandwidth, but instead celebrate the native response of the amplifying device by using zero (no) feedback. Also the use of operational amplifiers (op amps) is completely avoided as they are too clean and sterile sounding, i.e. they are extremely low distortion and have very wide bandwidth, and thus are very accurate but not very musical.

A third objective of the TIJO is to simplify the power supply by using a single voltage transformer to feed the filaments and produce a single low voltage B+. This is done with a 12 Volt AC transformer, a voltage doubler, and a zener regulator to provide about 30 Volts DC to the tube. This also enhances usability by allowing external placement of the tube as no high voltages are present.

The fourth objective of the TIJO is to provide a line driver audio amplifier that interfaces well with a vacuum tube operated at low voltage by presenting a high e to the tube output to minimize loading. The JFET is electronically and harmonically similar to the vacuum tube, except that it typically operates at lower voltages and higher currents, thus being optimum for the output stage to drive difficult loads.

The fifth objective of the TIJO is to allow the vacuum tube to be easily changed to various types including the 12AX7, 12AU7 and 12AT7. The different tubes provide different gains, plate resistances, bias responses, and, in general, overdrive differently to produce different tonal palettes.

Described generally, the TIJO comprises a vacuum tube having at least one grid for receiving an input signal, a plate run at low voltage for delivering a plate voltage responsive to the input signal, and a cathode connected to ground. The TIJO also comprises a JFET (Junction Field Effect Transistor) having a P-type region, or gate, diffused into an N type channel with a source or drain at each end for receiving an input signal at the gate from the tube with minimal loading and responding to said input signal by varying the resistance between source and drain, hence converting input voltage into output current. Both the vacuum tube and the JFET are supplied from a common low voltage B+. The TIJO utilizes zero feedback and is noninverting. The vacuum tube is mounted externally. There are various other devices to support the TIJO circuit like load resistors, coupling capacitors, and bias resistors which follow standard practices from prior art.

DETAILED DESCRIPTION OF THE INVENTION

The present invention is a Tube Input JFET Output (TIJO) hybrid preamplifier which includes a vacuum tube triode input stage and a junction field effect transistor output stage. Although specific embodiments of the present invention will be described with reference to the drawings, it should be understood that such embodiments are by way of example only and merely illustrative of but a small number of the many possible specific embodiments which can represent applications of the principles of the present invention.

Figure 1:
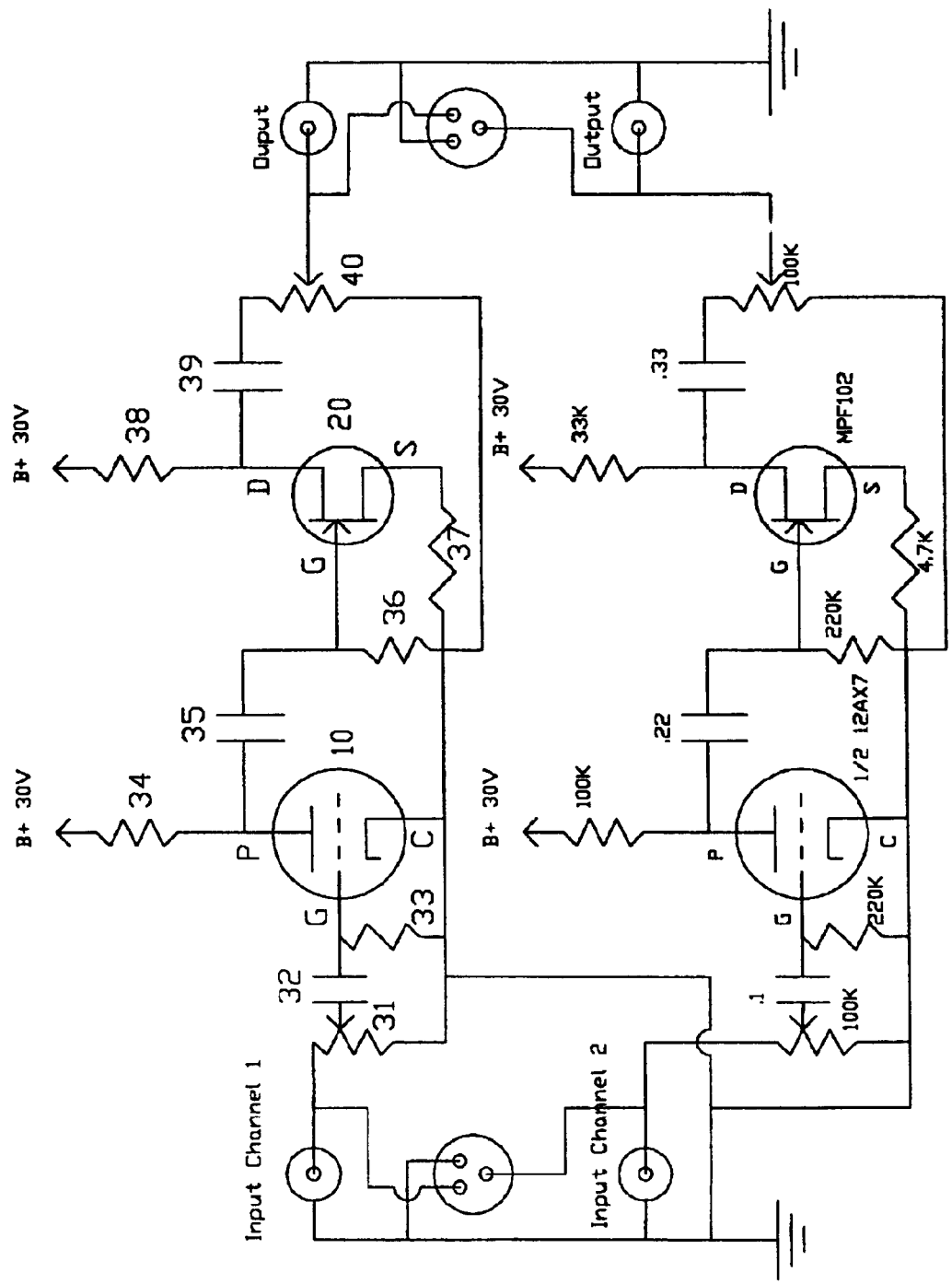
FIG. 1 is an electrical schematic digram of one embodiment of a Tube Input JFET Output hybrid preamplifier.

Referring to FIG. 1, the input port may be a quarter inch phone jack or an RCA phono jack, and an XLR jack. The XLR balanced input signal is split between both channels by connecting pin 2 to one channel and pin 3 to the other channel. The unbalanced input jacks require separate jacks for each channel. The two channels are identical except for their connection to the XLR jack, so the following will only describe the first channel.

The input port may connect to a variable resistor 31 or, optionally, directly connect to a DC blocking/AC coupling capacitor 32 which holds a grid bias charge. Said coupling capacitor connects to the grid of the vacuum tube 10 and also to a grid bias resistor 33. It is important that the input signal arrive at a vacuum tube stage first before going through any other amplifying device types.

The vacuum tube may be a 12AX7 with higher gain which is particularly suited to guitars, or a 12AU7 with lower gain which is particularly suited to microphones, or a 12AT7 with medium gain. The tonal palette varies significantly from one tube type to the next, and will even vary between similar tube types.

The cathode of the vacuum tube 10 is connected to ground, but may optionally be connected through a resistor and possibly a bypass capacitor. The plate of the vacuum tube 10 is connected to both a load resistor 34 and a DC blocking/AC coupling capacitor 35 which passes the signal to the JFET. Said plate load resistor 34 is connected to a low positive voltage of about 30 volts DC.

The coupling capacitor 35 is connected to the gate of the JFET 20 which is also connected to ground through a resistor 36. The source of the JFET 20 is connected to ground through a self bias resistor 37. Said bias resistor 37 may optionally be bypassed with a capacitor. The drain of the JFET 20 is connected to both a load resistor 38 and a DC blocking/AC coupling capacitor 39. Said drain load resistor 38 is connected to a low positive voltage of about 30 volts DC. The JFET may be of various types including the MPF102.

The coupling capacitor 39 is connected to a variable resistor 40 which has its wiper connected to the output port. The output port may be a quarter inch phone jack or an RCA phono jack, and an XLR jack. The XLR balanced output signal is split between both channels by connecting pin 2 to one channel and pin 3 to the other channel identically to the configuration of the input port. The unbalanced output jacks require separate jacks for each channel.

The low positive voltage required for the operation of the present invention can be generated with a voltage doubler connected to a 12 volt AC transformer, and then regulated down to a voltage of about 30 volts with a zener diode paralleling a storage capacitor in series with about two thousand ohms. Other means of generating the low positive voltage are possible and widely described in prior art. The heater filament voltage can be generated by the same 12 volt AC transformer.

Figure 2:
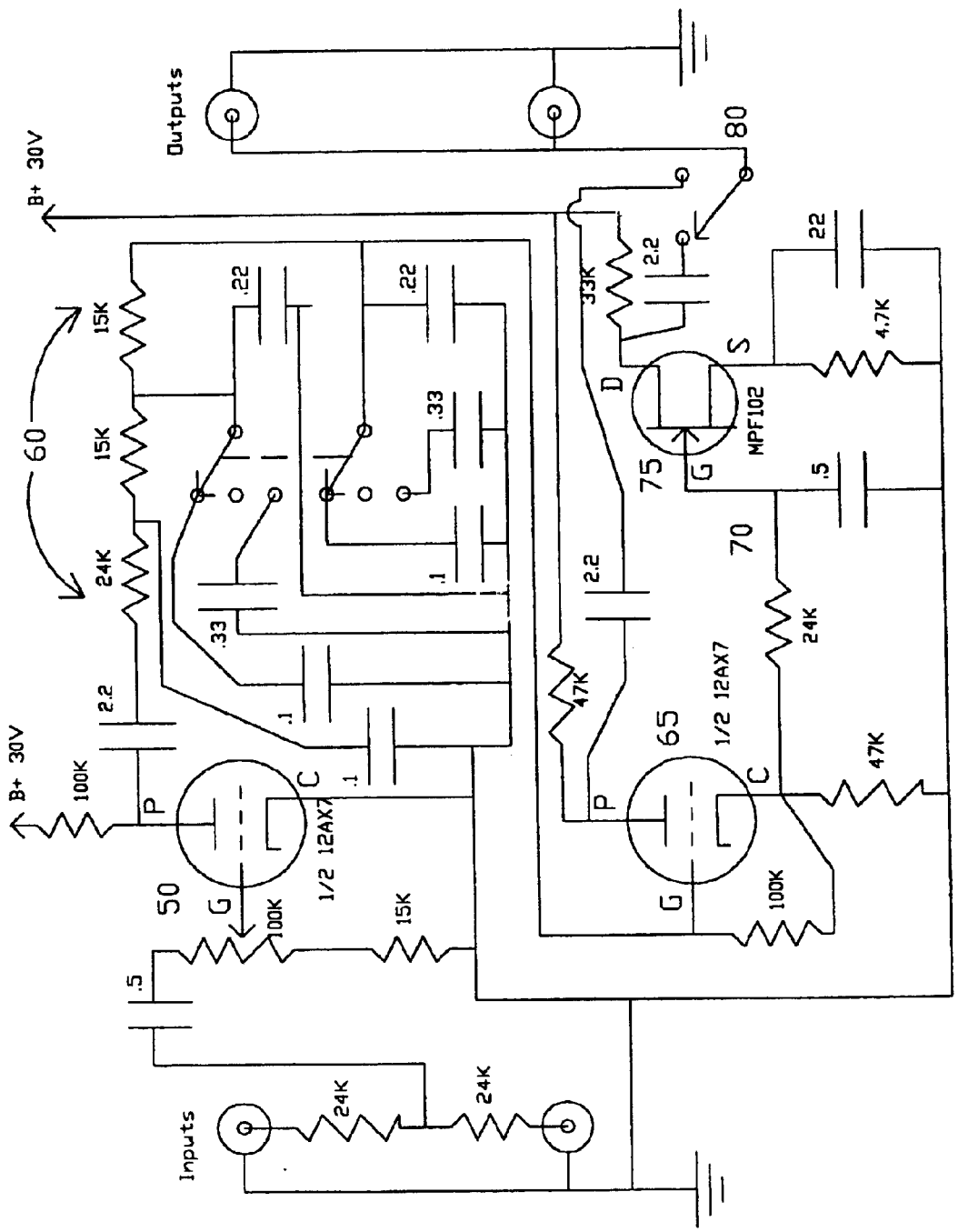
FIG. 2 is an electrical schematic diagram of another embodiment with an extra vacuum tube stage which can be used as a subwoofer crossover, equalizer, and booster.

Referring to FIG. 2, another embodiment of the present invention is shown which is a subwoofer crossover, equalizer, and booster. An extra vacuum tube stage has been added in addition to a low pass filter network. The input stage and the output stage are essentially the same as the embodiment in FIG. 1.

The first stage vacuum tube 50 feeds a first low pass filter stage 60 which feeds a second stage vacuum tube 65. The second stage vacuum tube 65 feeds a second low pass filter stage 70 which feeds the third stage JFET 75. The output is switch 80 selectable from either the second stage vacuum tube 65 or the third stage JFET 75, but the output from the vacuum tube is quite low. Because of the low B+ voltage, the vacuum tube has low transconductance and low gain, even with a so called high gain 12AX7 type tube. So the JFET actually has much higher output than the second stage vacuum tube. This illuminates the essence of the present invention, which is the JFET output stage, because without it, the circuit is not very practical, and with it the sweet sound of the vacuum tube passes through beautifully.

The following patents have some similarities to the present invention, but it will be shown that there are fundamental differences. The present invention will be referred to as TIJO (for Tube Input JFET Output).

U.S. Pat. No. 5,017,884 has a vacuum tube connected to a MOSFET, and in fact, every claim therein refers to a MOSFET. However, TIJO uses a JFET. Furthermore, the MOSFET is common drain connected with the output source connected which produces an inverted output, while TIJO is common source connected with the output drain connected which produces a non-inverted output. A fundamental difference between MOSFETs and JFETs is the power supply voltage requirements. TIJO uses a low voltage power supply for the vacuum tube and the JFET, while MOSFETs require higher voltages, and almost all prior art employing vacuum tubes use high voltages. Another big difference is TIJO does not use feedback while every claim of U.S. Pat. No. 5,017,884 focuses on the use of feedback, which appears to be the defining property of a transimpedance amplifier.

U.S. Pat. No. 4,163,198 has a vacuum tube connected to a P channel PET. However, TIJO uses an N channel JFET. Another difference is TIJO uses a low voltage power supply. The circuit topology of U.S. Pat. No. 4,163,198 is that of a CASCODE which is two stacked devices (the FET and the tube) forming a single gain stage while TIJO has two separate gain stages formed with the tube and the JFET. Furthermore, TIJO feeds the input signal to the grid of the vacuum tube but U.S. Pat. No. 4,163,198 has the input signal fed to the gate of the FET.

U.S. Pat. No. 5,022,305 has a vacuum tube powered by a low voltage power supply, but it does not use a JFET. Instead, U.S. Pat. No. 5,022,305 uses operational amplifiers. Another big difference is TIJO does not use the pull-up resistor biasing for the grid of the vacuum tube, which appears to be a fundamental property of U.S. Pat. No. 5,022,305. Furthermore, TIJO has the vacuum tube as the input stage, while U.S. Pat. No. 5,022,305 has the operational amplifier as the input stage.

U.S. Pat. No. 5,450,034 has a vacuum tube driving a bipolar transistor in a Reflected Plate Amplifier architecture with the vacuum tube operated at low voltage. Some of the design objectives of U.S. Pat. No. 5,450,034 are similar to the TIJO invention, but the circuit topology is completely different than TIJO as it appears to be similar to a CASCODE, that is the transistor is stacked on top of the vacuum tube and forms a single gain stage. Also, claim 1 of U.S. Pat. No. 5,450,034 specifies a transistor having a base, an emitter, and a collector, which is a standard bipolar type and quite different from a JFET having a gate, a drain, and a source. Furthermore, U.S. Pat. No. 5,450,034 uses a bi-polar power supply supplying positive and negative voltages, while TIJO uses a single positive voltage.

What I claim as my invention is:

1. A two stage hybrid preamplifier comprising:
   a. a vacuum tube input having at least one grid, one plate, one cathode, and a method of heating said cathode;
   b. a DC blocking/AC coupling capacitor for maintaining bias on said grid of the vacuum tube and passing the input signal;
   c. a load resistor connecting said plate to a low voltage positive power supply;
   d. said cathode connected to ground;
   e. a JFET (junction field effect transistor) output stage comprising a gate, a source, and a drain;
   f. a DC blocking/AC coupling capacitor connecting said plate of said vacuum tube to said gate;
   g. a load resistor connecting said drain to a low voltage positive power supply;
   h. said source referenced to ground through a resistor;
   i. said gate referenced to ground through a resistor;
   j. a DC blocking/AC coupling capacitor connected to said drain for producing an output signal;
   k. whereby said output signal is in-phase with the control grid voltage of said vacuum tube and is responsive to said input signal.

2. The apparatus as defined in claim 1 further comprising a grid leak resistor element connected between said control grid of said vacuum tube and ground.

3. The apparatus as defined in claim 1 further comprising a resistor connected between said cathode of said vacuum tube and ground instead of directly to ground.

4. The apparatus as defined in claim 3 further comprising a capacitor connected between said cathode of said vacuum tube and ground.

5. The apparatus as defined in claim 1 further comprising a capacitor connected between said source of said JFET and ground.

6. The apparatus as defined in claim 1 further comprising an equalization circuit connected between said vacuum tube and said JFET for the purpose of shaping the frequency response.

7. The apparatus as defined in claim 1 further comprising an external mounting for said vacuum tube for the purpose of quick and easy tube changes.

8. The apparatus as defined in claim 1 further comprising a simple power supply with a single transformer with a single output voltage capable of supplying said vacuum tube heater, and additionally, in conjunction with a voltage doubler, tripler, or quadrupler circuit, capable of supplying the low voltage positive power for said vacuum tube and said JFET.

9. A two channel hybrid preamplifier comprising of each channel being an apparatus as defined in any of claims 1 through 8 for the purpose of the following:
   a. stereo operation;
   b. cascade operation with said two channels connected in series;
   c. surround sound center channel and subwoofer channel operation with different equalization circuitry on each channel;
   d. balanced operation where said input signal is not referenced to ground and each of the two input wires is connected separately to said grids of said vacuum tubes through said coupling capacitors.

* * * * *